(12) United States Patent
Daamen (10) Patent No.: US 7,790,606 B2
(45) Date of Patent: Sep. 7, 2010

(54) METHOD OF FORMING AN INTERCONNECT STRUCTURE

(75) Inventor: Roel Daamen, Herkenbosch (NL)

(73) Assignee: NXP B.V., Eindhoven (NL)

( * ) Notice: Subject to any disclaimer, the term of this patent is extended or adjusted under 35 U.S.C. 154(b) by 47 days.

(21) Appl. No.: 12/444,677

(22) PCT Filed: Oct. 5, 2007

(86) PCT No.: PCT/IB2007/054070

§ 371 (c)(1),
(2), (4) Date: Apr. 7, 2009

(87) PCT Pub. No.: WO2008/044181

PCT Pub. Date: Apr. 17, 2008

(65) Prior Publication Data

US 2010/0105202 A1    Apr. 29, 2010

(30) Foreign Application Priority Data

Oct. 9, 2006    (EP) .................. 06122003

(51) Int. Cl.
*H01L 21/4763* (2006.01)
(52) U.S. Cl. .............. 438/627; 438/629; 438/637; 438/638; 257/E21.576; 257/E21.584
(58) Field of Classification Search .......... 438/627, 438/629, 622, 637, 638; 257/E21.584, E21.576
See application file for complete search history.

(56) References Cited

U.S. PATENT DOCUMENTS

| | | | |
|---|---|---|---|
| 6,165,898 A | 12/2000 | Jang et al. | |
| 6,166,423 A | 12/2000 | Gambino et al. | |
| 6,323,123 B1 * | 11/2001 | Liu et al. | 438/638 |
| 7,235,479 B2 * | 6/2007 | Verhaverbeke | 438/637 |
| 7,635,645 B2 * | 12/2009 | Lee et al. | 438/637 |
| 2004/0175932 A1 * | 9/2004 | Kim et al. | 438/637 |
| 2005/0194688 A1 | 9/2005 | Gotkis et al. | |
| 2006/0105567 A1 * | 5/2006 | Ramachandrarao et al. | 438/637 |
| 2007/0035816 A1 * | 2/2007 | Daamen et al. | 359/360 |

FOREIGN PATENT DOCUMENTS

| | | |
|---|---|---|
| EP | 1577940 | 9/2005 |
| EP | 06115669.1 | 6/2006 |
| JP | 2003124309 | 4/2003 |

OTHER PUBLICATIONS

Hinsinger, O., et al; "Demonstration of an Extendable and Industrial 300MM BEOL Integration for the 65-NM Technology Node"; IDEM Technical Digest; Dec. 2004; pp. 317-320.

* cited by examiner

*Primary Examiner*—Michael Trinh (57) ABSTRACT

A method of forming an interconnect structure in a semiconductor device in which via holes (62) defined in a dielectric layer are filled with a filler material (64), such as a porogen material, before a further dielectric layer (66) is deposited thereover. Trenches (72) are formed in the further dielectric layer and then the filler material exposed thereby in the via holes is removed. The method provides a robust process which affords improved via and trench profile control.

9 Claims, 11 Drawing Sheets

METHOD OF FORMING AN INTERCONNECT STRUCTURE

FIELD OF THE INVENTION

The present invention relates to a method of forming an interconnect structure for a semiconductor device, and more particularly to formation of such a structure in a multi-level interconnect configuration.

BACKGROUND OF THE INVENTION

The feature size of integrated circuit semiconductor devices has decreased steadily and as a result the performance of the interconnections between different portions of the device has become an increasingly significant factor in the performance of the device as a whole. Furthermore, the increasing complexity and reduction in size of the devices has increased the need for multi-layer interconnects.

Such interconnects may be manufactured using the so-called "damascene" process, in which a dielectric layer is formed and then etched away leaving a pattern of trenches defining the paths of the desired interconnections. Interconnect metal is then deposited to fill the trenches. This leaves an uneven surface formed by excess metal. A chemical-mechanical polishing (CMP) step is then used to planarize the structure, removing the excess metal from the surface to provide a flat surface suitable for further processing.

Typically, a multi-layer structure is built up from alternating trench layers and via layers. The trench layers include the horizontal interconnects and the via layers provide the vertical connections between the different levels of the multiple interconnect layers and to the underlying semiconductor device.

An important performance characteristic for interconnect structures is minimisation of transmission delays. Such delays are typically determined by the resistance and capacitance of the interconnect. For this reason, copper is increasingly preferred due to its relatively low resistance. Copper can be combined with insulating materials with low dielectric constants, known as low-k materials, to provide interconnects with good performance.

SUMMARY OF THE INVENTION

The present invention provides a method of forming an interconnect structure for a semiconductor device, comprising:

(a) depositing a first dielectric layer;
(b) patterning the first dielectric layer to form via holes in the first dielectric layer;
(c) filling the via holes with a filler material which is selectively etchable with respect to the material of the first dielectric layer;
(d) depositing a second dielectric layer over the first dielectric layer which is selectively etchable with respect to the filler material;
(e) patterning the second dielectric layer to form trenches defining interconnections provided by the interconnect structure in the second dielectric layer;
(f) removing filler material exposed by the trenches from the via holes; and
(g) depositing electrically conductive material to fill the trenches and via holes.

This method provides a relatively robust process leading to improved via and trench profile control.

Previous processes have been found to be prone to corner rounding at the via/trench interface and also variation in trench depth. The present process improves the profiles so that they more closely correspond to the sharper profiles desired by device designers. Better control of the lateral and vertical dimensions of the interconnects and associated dielectric layers improves the timing and power performance of the associated device.

Preferably the filler material used to fill the via holes is an organic material having a decomposition temperature higher than the temperature at which deposition of the second dielectric layer is carried out.

The process of depositing the second dielectric layer is typically carried out at a temperature up to around 350° C. Accordingly, the filler material preferably has a decomposition temperature higher than 350° C.

In the patterning step (e) a photoresist layer may be employed which is formed of an organic material that can then be etched away in the same process as removal of the filler material in step (f).

In carrying out filler material removal step (f), the filler material may be etched away, or alternatively, it may be removed by decomposition.

A preferred material for use as the filler material is a thermally degradable polymer (TDP) material, this type of material often being referred to as porogen material.

Suitable choices for the porogen material include polymers of the methacrylate family including resists, which may be fluorinated. Several suitable materials are available from vendors which may include Shipley XP0733™ JRSMicro TDP-C1002™ and Dow Chemical's Houdini™

Other examples of organic materials that can be used to fill the via holes include SiLK (a paralene material from Dow Chemical) or organic BCB-type materials.

Suitable organic filler materials may be of sufficiently low viscosity to fill the via holes and form a substantially level upper surface without requiring further planarization processing. Where the properties of the particular polymer selected may not facilitate this, a chemical-mechanical polishing step may be employed to planarize the upper surface of the via layer.

Preferably, the first and second dielectric layers are formed of a low-k dielectric material. Such materials are considered to have a dielectric constant of around 3 or below. Porous materials are particularly preferred such as the materials sold as Black Diamond™ or Aurora™. Further examples are BD2x™ and Coral™.

Where the first dielectric layer is deposited over an existing interconnect structure, a diffusion barrier layer is preferably provided in a self-aligned manner over the top of the electrically conductive interconnect material of the underlying structure. A preferred method for forming such a barrier layer is described in co-pending unpublished European Patent Application No. 06115669.1 of 19 Jun. 2006 (NXP reference PH005919). The contents of that application are incorporated herein as reference material.

BRIEF DESCRIPTION OF THE DRAWINGS

A known process and an embodiment of the invention will now be described by way of example and with reference to the accompanying schematic drawings, wherein.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

DETAILED DESCRIPTION OF THE DRAWINGS

Figure 1:
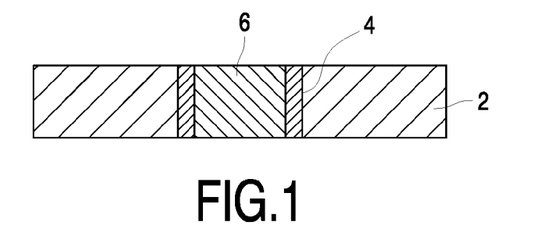
FIGS. 1 to 12 show cross-sectional side views of successive stages in the formation of an interconnect structure according to a known process.
Figure 2:
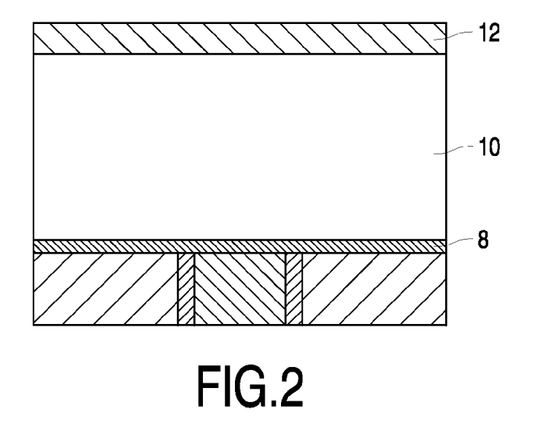
Figure 3:
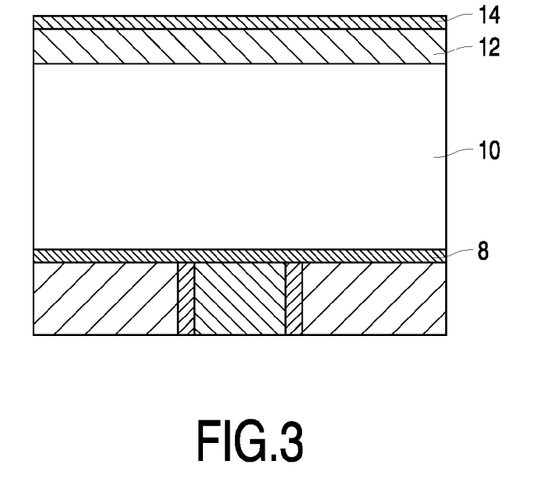

A known interconnect structure fabrication process will now be described with reference to FIGS. 1 to 12. FIG. 1 shows part of a layer of low-k dielectric material 2 which defines a trench 4. An interconnect 6 formed of copper is provided in the trench having a barrier layer on either side and the bottom, typically formed of TaN/Ta or TiN. As shown in FIGS. 2 and 3, a barrier layer 8 of SiC(N) or SiN is deposited over the initial layer followed by significantly thicker layer 10 of SiOC in which trenches and vias are in due course to be defined. Layer 10 is then capped by a hard mask formed of successively deposited layers 12, 14 of TEOS and TiN.

Figure 4:
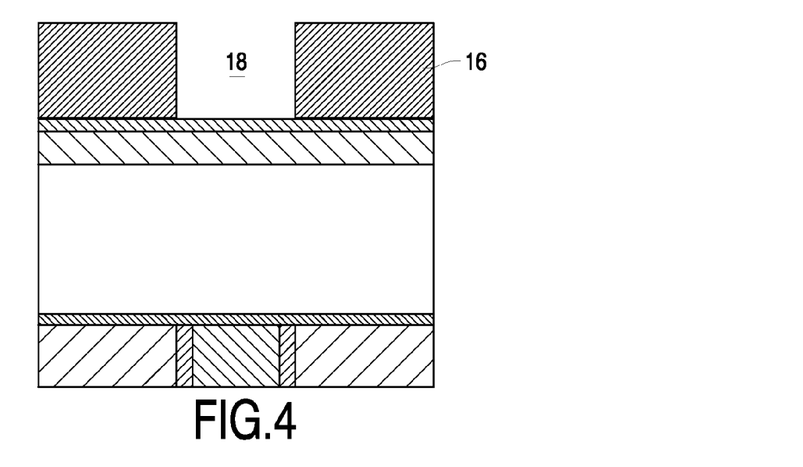
Figure 5:
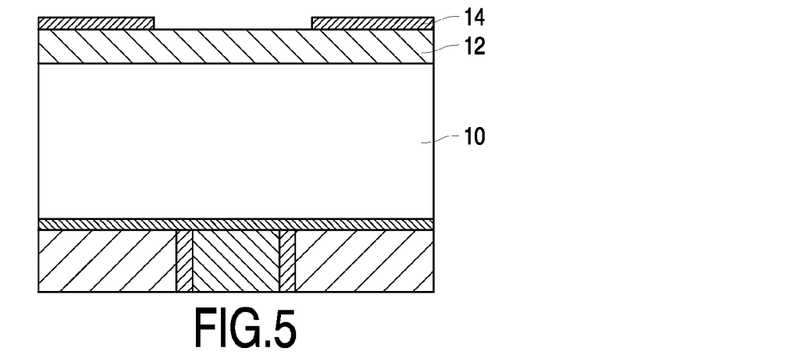

Next, a layer of photoresist material 16 is deposited and then patterned forming a window 18 as shown in FIG. 4. A dry etch is then carried out to etch the TiN layer where it is exposed at window 18 to form a structure shown in FIG. 5.

Figure 6:
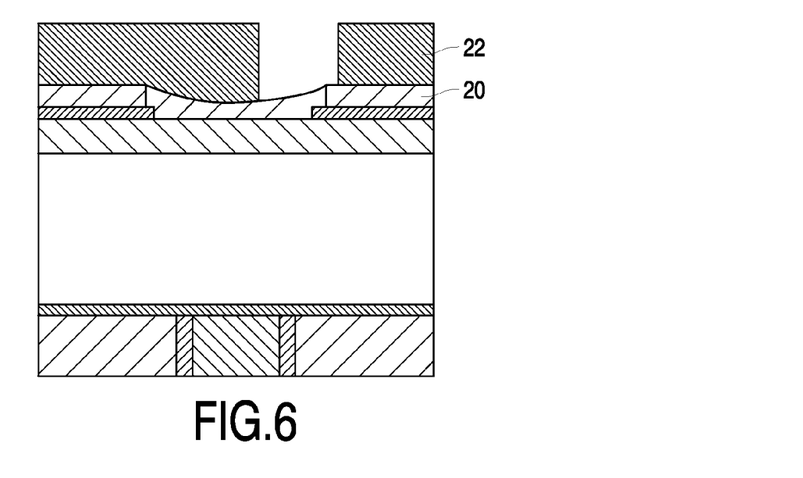

A layer 20 of BARC material is then deposited, followed by a further layer 22 of photoresist which is patterned photolithographically (see FIG. 6).

Figure 7:
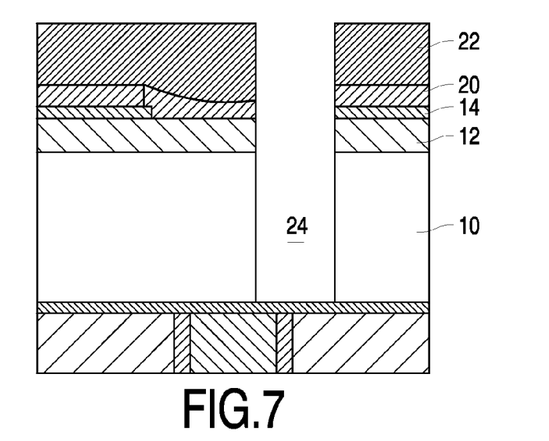

An etch process is carried out via the window defined in photoresist layer 22 removing in turn exposed material of the BARC layer, the TEOS layer, and the SiOC layer, as shown in FIG. 7. This forms a via 24.

Figure 8:
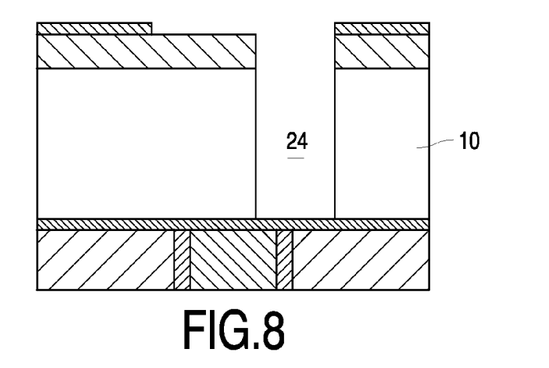
Figure 9:
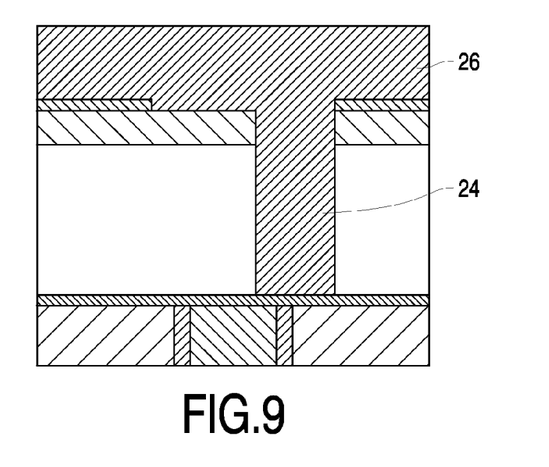
Figure 10:
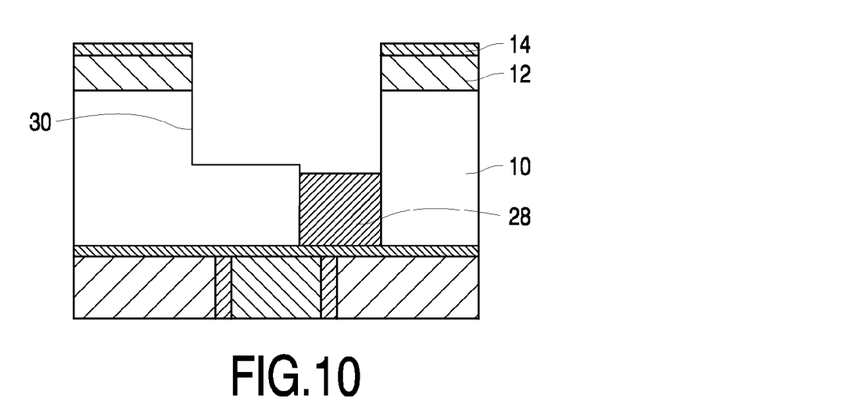

The photoresist layer 22 and BARC layer 20 are subsequently removed as shown in FIG. 8.

Figure 11:
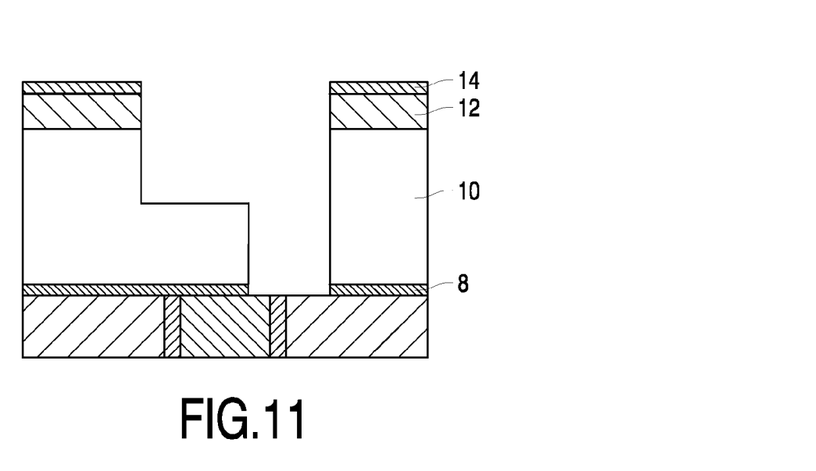

Further photoresist material 26 is now deposited, filling the via and also extending over the upper surface of the structure. The photoresist material is largely stripped away, but a portion 28 at the bottom of the via is retained (see FIG. 10). The TEOS layer and underlying SiOC material is then etched away at the window defined by the TiN layer 14 to form a trench 30. Photoresist portion 28 acts to preserve the profile of the via 24 during this process and can then be stripped away. The underlying area of the barrier layer 8 is also etched away as shown in FIG. 11.

Figure 12:
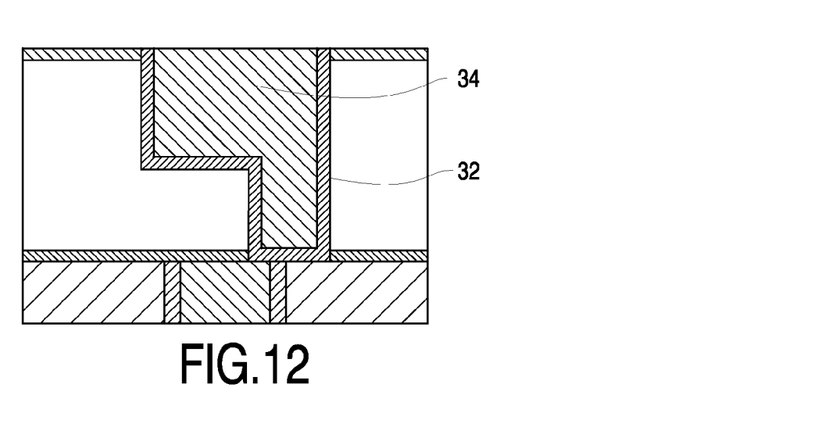

A liner layer 32 of TaN/Ta is formed over the walls of the trench 30 and via 24 to as shown in FIG. 12, before these features are filled by a deposition of metallic interconnect material 34, typically copper.

A similar process is disclosed in a paper entitled "Demonstration of an extendable and industrial 300 mm BEOL integration for the 65-nm technology node", published in IDEM Tech. Dig., pp. 317-320, December 2004, the contents of which are incorporated herein as reference material.

A process embodying the invention will now be described with reference to FIGS. 13 to 26.

Figure 13:
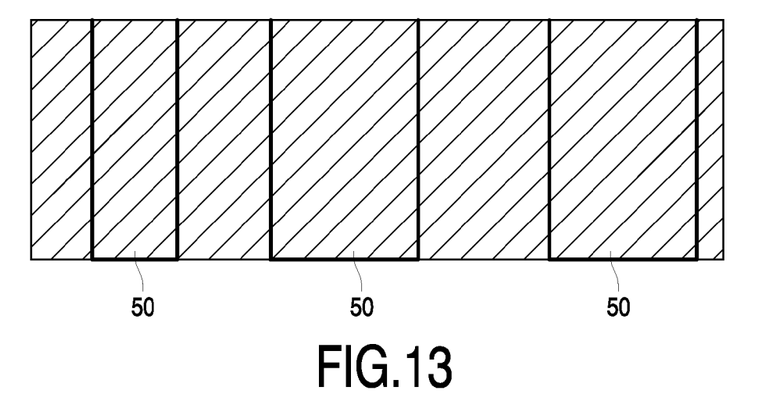
FIGS. 13 to 26 show cross-sectional side views of successive stages in the manufacture of an interconnect structure according to embodiments of the invention.
Figure 14:
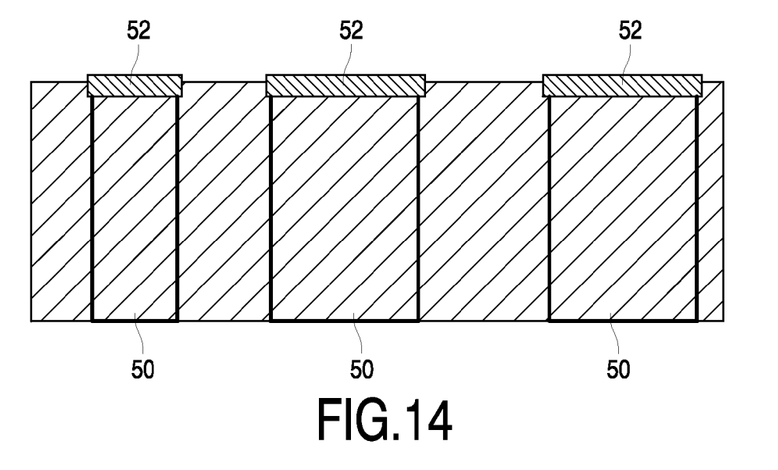
Figure 15:
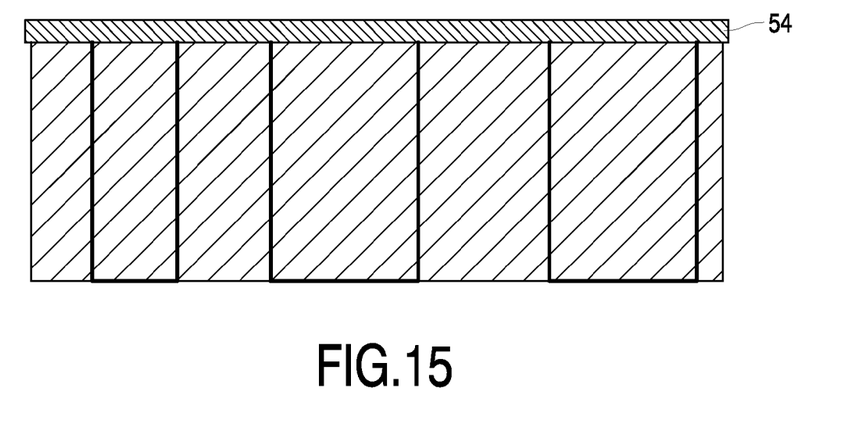

The starting point is similar to that shown in FIG. 1, except that three copper interconnects 50 are present by way of example in the existing interconnect structure shown in FIG. 13. A barrier layer is then formed over this structure. This is preferably defined in a self-aligned manner, as shown in FIG. 14, with discrete barrier layer regions 52 extending over the upper surfaces of respective copper interconnects 50. Alternatively, a continuous barrier layer 54 (formed of SiCN for example) may be formed, as shown in FIG. 15.

Figure 16:
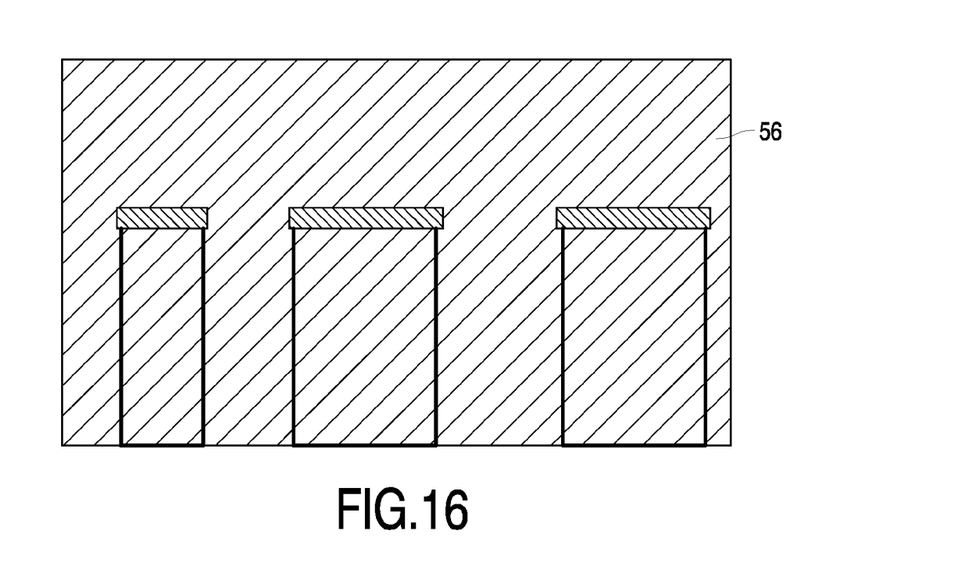

A layer 56 of low-k dielectric is then deposited. The via holes will be defined in this layer and the layer may typically be around 100 to 300 nm thick.

Figure 17:
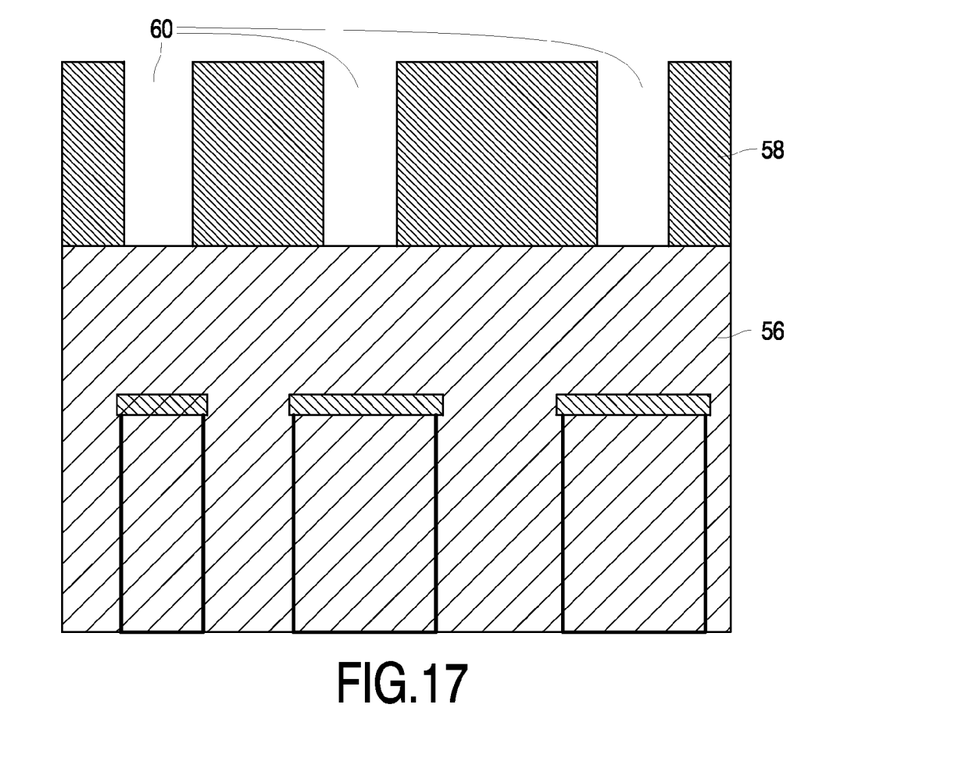
Figure 18:
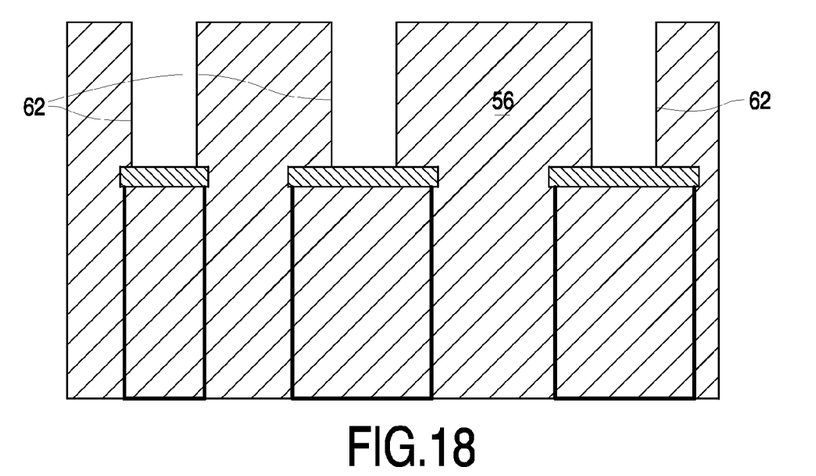

A photoresist layer 58 is then deposited and patterned photolithographically as shown in FIG. 17 to form windows 60. Dielectric layer 56 is anisotropically etched at the windows 60 to form vias 62 (see FIG. 18).

Figure 19:
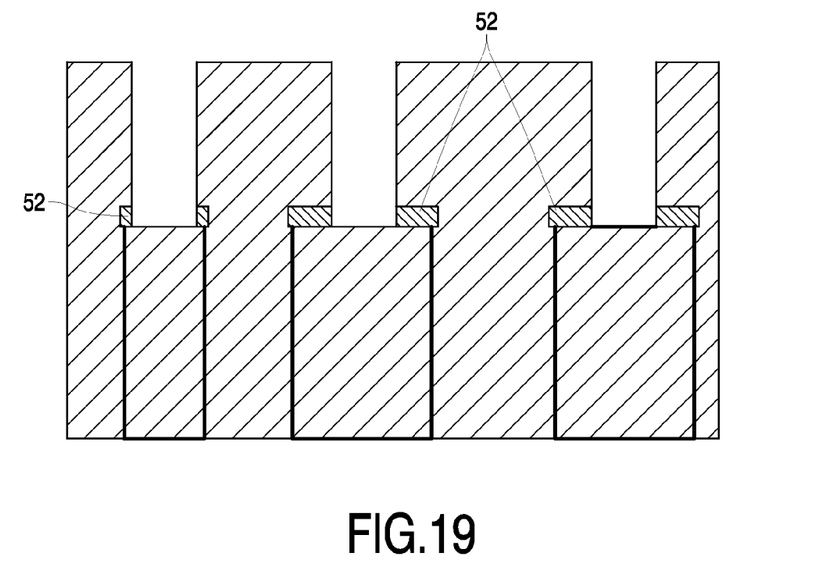

Optionally, areas of the diffusion barrier layers 52 exposed at the bottom of the vias may be etched away at this stage as shown in FIG. 19. Alternatively, this step may be carried out later in processing as described below.

Figure 20:
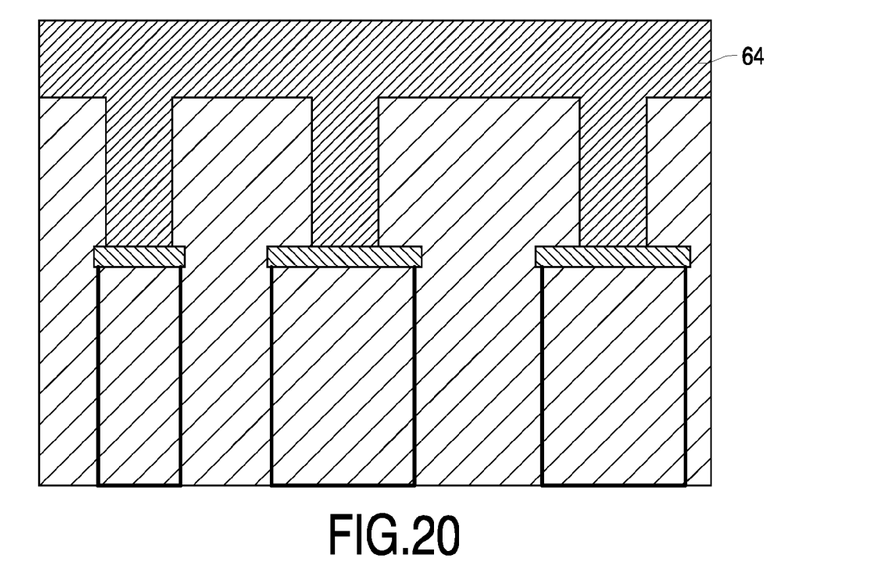
Figure 21:
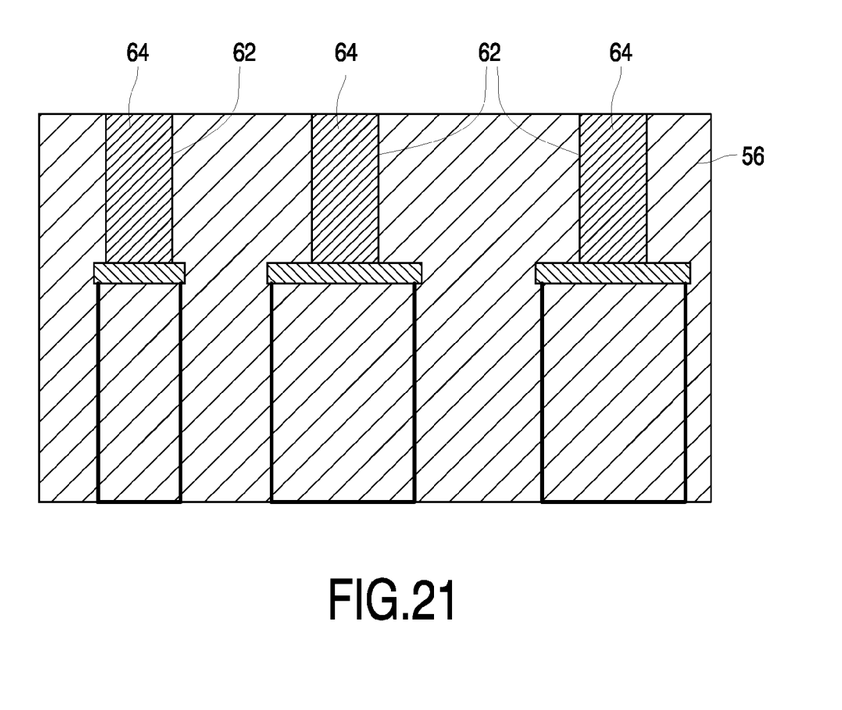
Figure 22:
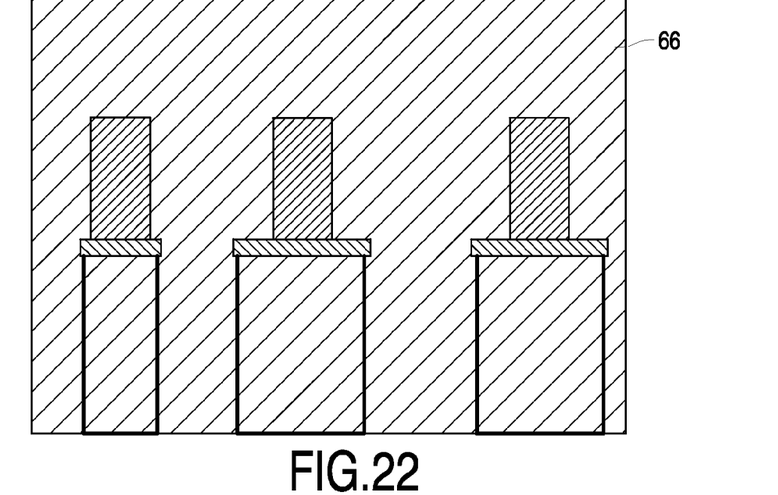

A filler material 64 is then deposited to fill the via holes 62. This filler material, preferably a porogen material, may also extend over the upper surface of the structure as shown in FIG. 20. In that case, a planarization process, such as an etch back or chemical-mechanical polishing, is carried out to remove this overlying material and expose the underlying dielectric material, as shown in FIG. 21. If the viscosity of the filler material is such that the via holes can be filled completely without excess material overlying the structure, such a planarization process may not be required. Next, a further layer 66 of dielectric material is deposited as shown in FIG. 22. Interconnect trenches are defined in this layer, which may be around 100 to 300 nm thick.

Figure 23:
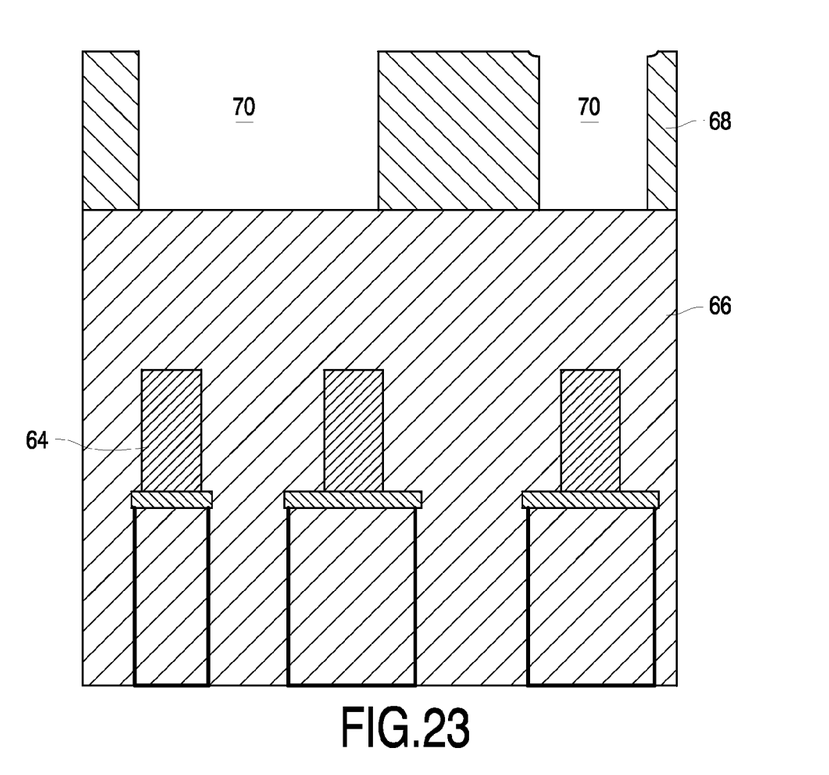

A further photoresist layer 68 is now deposited and patterned photolithographically as shown in FIG. 23. An anisotropic etch process is carried out to remove material in dielectric layer 66 exposed at windows 70 of photoresist mask 68. This forms trenches 72.

Figure 24:
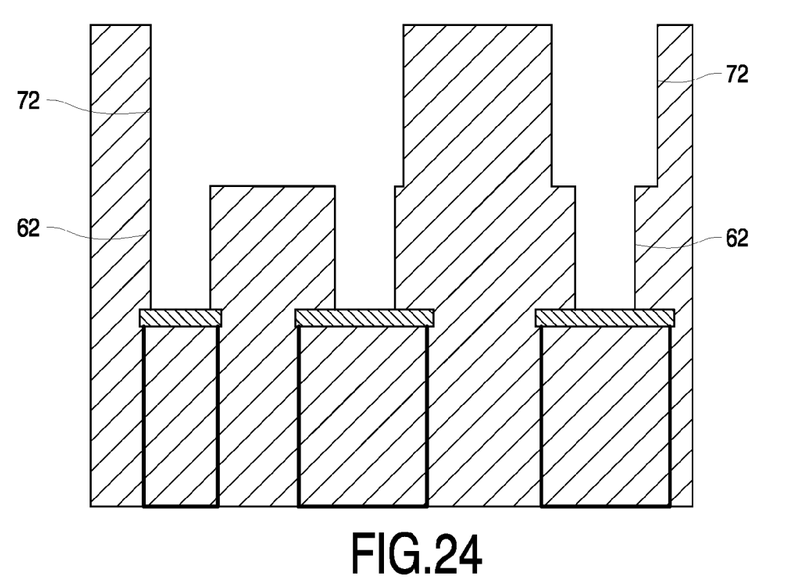
Figure 25:
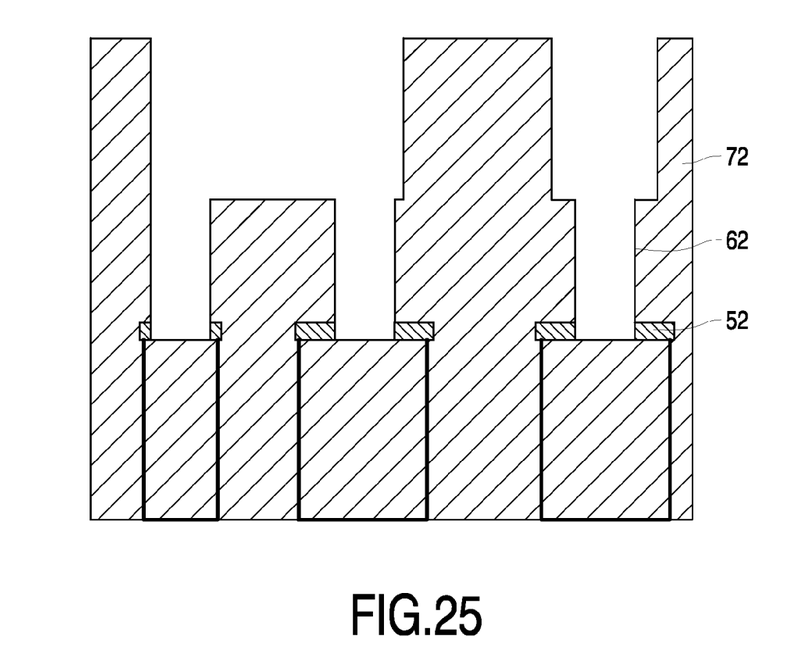

A further etch is carried out to remove the filler material 64 from the via holes 62 as shown in FIG. 24.

Where openings in barrier layers 52 have not already been formed in the manner described with reference to FIG. 19, an appropriate etch process may now be carried out as shown in FIG. 25.

Figure 26:
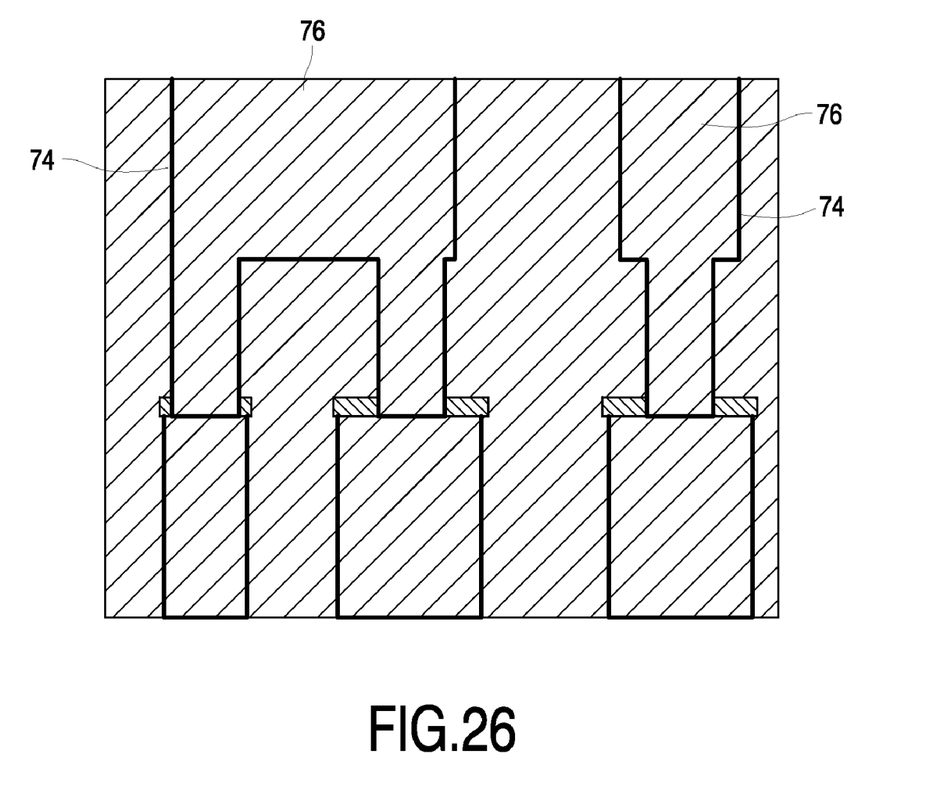

Finally, a liner layer 74 (typically of TaN/Ta) is formed over the walls of the via 62 and trenches 72 and the remaining volume of these features filled with interconnect metal 76 to complete the interconnect structure, as shown in FIG. 26.

Alternatively, prior to inclusion of the interconnect metal, a punch-through process may be employed to remove the liner layer 74 from the bottom of the vias. In this case a Cu—Cu contact is formed between the vias and the underlying connections in the finished device, greatly reducing the via resistance.

The embodiments described with reference to FIGS. 13 to 26 exhibit a number of advantages relative to the known process shown in FIGS. 1 to 12.

It can be seen that in the embodiments, the vias are formed simply by etching through a dielectric layer, rather than three multiple layers as shown in the known process. This assists in ensuring that all the via holes will be opened before continuing to define the trench level.

A TiN hard mask is no longer required. This removes the need for dedicated TiN dry etch tools, leading to an increase in throughput. Furthermore, the presence of TiN can lead to build-up of TiN-containing polymers on the electrode requiring a number of cleaning cycles, further decreasing throughput.

TiN polymer may also stay on the wafer and decrease the via critical dimension ("CD"), thereby increasing the via resistance. In an extreme cases it may even form an etch stop at the base of the via.

In an alternative process, dielectric layer 66 may instead be formed from porogen material deposited in the same step as the filler material 64. The via filler to material is then etched away during the same etch process as formation of the trenches in the layer 66. However, the approach depicted in the Figures is preferred as control of the etch time is less critical. This is because all the exposed porogen material is etched away. In the alternative approach, too long an etch can lead to over-etch of the porogen material in the trench-defining layer, impairing definition of the trenches.

Device performance may be improved further by including air gaps around the interconnects. Since air has a dielectric constant k of 1, this may offer improved performance relative to interconnects surrounded by low-k dielectrics alone. A method of manufacturing a multi-level interconnect with air gaps is described in EP1577940, the contents of which are incorporated herein by reference.

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

The invention claimed is:

1. A method of forming an interconnect structure for a semiconductor device, comprising:
   (a) depositing a first dielectric layer;
   (b) patterning the first dielectric layer to form via holes in the first dielectric layer;
   (c) filling the via holes with a filler material, wherein the filler material comprises an organic material that is selectively etchable with respect to the material of the first dielectric layer, and wherein the filler material has a decomposition temperature higher than 350° C.;
   (d) depositing a second dielectric layer over the first dielectric layer which is selectively etchable with respect to the filler material, wherein said deposition of the second dielectric layer is carried out at a temperature below 350° C.;
   (e) patterning the second dielectric layer to form trenches defining interconnections provided by the interconnect structure in the second dielectric layer;
   (f) removing filler material exposed by the trenches from the via holes; and
   (g) depositing electrically conductive material to fill the trenches and via holes.

2. A method of claim 1 wherein patterning step (e) includes depositing and patterning a photoresist layer formed of an organic material, and the patterned photoresist layer is etched away in the same etch process as the filler material in etch step (f).

3. A method of claim 1 wherein the filler material is removed in step (f) by decomposition thereof.

4. A method of claim 2 wherein the filler material is a porogen material.

5. A method of claim 1 wherein the via holes are filled with filler material in step (c) to define a substantially level upper surface without requiring a further planarization process.

6. A method of claim 1 wherein the first and second dielectric layers are formed of a low-k dielectric material having a dielectric constant below 3.

7. A method of claim 1 wherein the first dielectric layer is deposited in step (a) over an existing interconnect structure, and a self-aligned diffusion barrier layer is provided over electrically conductive material of the existing interconnect structure.

8. A method of claim 1 wherein the first dielectric layer is deposited in step (a) over an existing interconnect structure, and a diffusion barrier is provided over electrically conductive material of the existing interconnect structure, the method including a step after via hole formation step (b) and before filling step (c) of etching away areas of the diffusion barrier layer exposed by the via holes.

9. A method of claim 1 wherein the first dielectric layer is deposited in step (a) over an existing interconnect structure, and a diffusion barrier is provided over electrically conductive material of the existing interconnect structure, the method including a step after filler material etching step (f) of etching away areas of the diffusion barrier layer exposed by the via holes.

* * * * *